United States Patent
Kim et al.

(10) Patent No.: US 8,372,669 B2
(45) Date of Patent: Feb. 12, 2013

(54) SEMICONDUCTOR LIGHT EMITTING DEVICE HAVING PATTERNED SUBSTRATE AND MANUFACTURING METHOD OF THE SAME

(75) Inventors: Sun Woon Kim, Seoul (KR); Hyun Kyung Kim, Suwon (KR); Hyung Ky Back, Suwon (KR); Jae Ho Han, Daejeon (KR)

(73) Assignee: Samsung Electronics., Ltd., Seoul (KR)

( * ) Notice: Subject to any disclaimer, the term of this patent is extended or adjusted under 35 U.S.C. 154(b) by 0 days.

(21) Appl. No.: 13/176,712

(22) Filed: Jul. 5, 2011

(65) Prior Publication Data

US 2011/0263061 A1  Oct. 27, 2011

Related U.S. Application Data

(62) Division of application No. 12/273,512, filed on Nov. 18, 2008, now Pat. No. 7,999,272.

(30) Foreign Application Priority Data

Jul. 8, 2008 (KR) ........................ 10-2008-0065924

(51) Int. Cl.
*H01L 21/00* (2006.01)
(52) U.S. Cl. ................. 438/29; 438/26; 438/46
(58) Field of Classification Search .............. 438/26, 438/27, 29, 32, 35, 42, 46
See application file for complete search history.

(56) References Cited

U.S. PATENT DOCUMENTS

| | | | |
|---|---|---|---|
| 5,814,839 A | 9/1998 | Hosoba | |
| 6,091,083 A * | 7/2000 | Hata et al. | 257/79 |
| 6,781,159 B2 | 8/2004 | Romano et al. | |
| 6,812,499 B2 | 11/2004 | Kondo et al. | |
| 6,815,886 B2 | 11/2004 | Kawase | |
| 7,071,494 B2 | 7/2006 | Steigerwald et al. | |
| 7,095,062 B2 | 8/2006 | Linthicum et al. | |
| 7,285,800 B2 | 10/2007 | Lai et al. | |
| 7,419,912 B2 * | 9/2008 | Donofrio | 438/694 |
| 7,470,938 B2 | 12/2008 | Lee et al. | |
| 7,598,105 B2 * | 10/2009 | Lee et al. | 438/44 |
| 7,612,381 B2 | 11/2009 | Kamiyama et al. | |
| 7,683,386 B2 | 3/2010 | Tanaka et al. | |
| 7,713,769 B2 | 5/2010 | Lin et al. | |
| 2004/0089869 A1 | 5/2004 | Uemura | |

(Continued)

FOREIGN PATENT DOCUMENTS

| | | |
|---|---|---|
| JP | 58-091689 | 5/1983 |
| JP | 08-083802 | 3/1996 |

(Continued)

OTHER PUBLICATIONS

K. Hiramatsu et al., "Recent Progress in Selective Area Growth and Epitaxial Lateral Overgrowth of III-Nitrides: Effects of Reactor Pressure in MOVPE Growth", Phys. Stat. Sol. (a), vol. 176, pp. 535-543, 1999.

*Primary Examiner* — Kevin M Picardat
(74) *Attorney, Agent, or Firm* — McDermott Will & Emery LLP

(57) ABSTRACT

There is provided a semiconductor light emitting device having a patterned substrate and a manufacturing method of the same. The semiconductor light emitting device includes a substrate; a first conductivity type nitride semiconductor layer, an active layer and a second conductivity type nitride semiconductor layer sequentially formed on the substrate, wherein the substrate is provided on a surface thereof with a pattern having a plurality of convex portions, wherein out of the plurality of convex portions of the pattern, a distance between a first convex portion and an adjacent one of the convex portions is different from a distance between a second convex portion and an adjacent one of the convex portions.

13 Claims, 6 Drawing Sheets

| U.S. PATENT DOCUMENTS | | | | FOREIGN PATENT DOCUMENTS | | |
|---|---|---|---|---|---|---|
| 2005/0082546 A1 | 4/2005 | Lee et al. | JP | 8-222763 | 8/1996 |
| 2007/0085093 A1 | 4/2007 | Ohmae et al. | JP | 2003-197963 | 7/2003 |
| 2008/0173863 A1 | 7/2008 | Hahn et al. | JP | 2003197963 A | 7/2003 |
| 2008/0217638 A1 | 9/2008 | Choi | JP | 2006-228817 | 8/2006 |
| 2008/0230793 A1 | 9/2008 | Yoon et al. | JP | 2007-266401 | 10/2007 |
| 2008/0277686 A1 | 11/2008 | Tsai | JP | 2008-53385 | 3/2008 |
| 2008/0290346 A1 | 11/2008 | Shim | JP | 2009-176805 | 8/2009 |
| 2009/0072262 A1 | 3/2009 | Iza et al. | KR | 10-2004-0019352 | 3/2004 |
| 2009/0159910 A1 | 6/2009 | Lin et al. | KR | 10-2005-0038207 | 4/2005 |
| 2009/0186435 A1 | 7/2009 | Yeh et al. | | | |
| 2010/0102351 A1 | 4/2010 | Kim et al. | | | |

\* cited by examiner

SEMICONDUCTOR LIGHT EMITTING DEVICE HAVING PATTERNED SUBSTRATE AND MANUFACTURING METHOD OF THE SAME

CROSS-REFERENCE TO RELATED APPLICATIONS

The present application is a divisional application of U.S. patent application Ser. No. 12/273,512 entitled "SEMICONDUCTOR LIGHT EMITTING DEVICE HAVING PATTERNED SUBSTRATE," filed on Nov. 18, 2008, which claims priority of Korean Patent Application No. 2008-65924 filed on Jul. 8, 2008, in the Korean Intellectual Property Office, all of which are hereby incorporated by reference in their entirety for all purposes.

BACKGROUND OF THE INVENTION

1. Field of the Invention

The present invention relates to a semiconductor light emitting device having a patterned substrate, and a manufacturing method of the same, and more particularly, to a light emitting device having a locally irregular pattern on a growth substrate to prevent a decline in light extraction efficiency resulting from total internal reflection and increase a surface area of an active layer, thereby enhancing external quantum efficiency.

2. Description of the Related Art

A light emitting efficiency of a light emitting device is determined by internal quantum efficiency and extraction efficiency. In general, the internal quantum efficiency is determined chiefly by a structure of an active layer and a quality of an epitaxial film. The extraction efficiency is governed by refractivity of materials or flatness of a surface or an interface. An InAlGaN-based nitride semiconductor has a refractivity of 2.2 to 2.9, and a GaN nitride semiconductor has a refractivity of 2.4. A sapphire employed as a substrate of such semiconductors has a refractivity of 1.78, and an epoxy resin has a refractivity of 1.5.

FIG. 1 illustrates paths of light in a nitride light emitting device.

As shown in FIG. 1, light generated from the nitride light emitting device, when having an incident angle greater than a critical angle due to differences in refractivity, undergoes total internal reflection and thus cannot be extracted outward. That is, at an interface between GaN/air 12 and 13, the light has a critical angle of about 23.6 degrees and subsequently a light extraction efficiency of about 6%. Also, at an interface between GaN/sapphire substrate 12 and 11, the light has an extraction efficiency of about 13%. A pattern may be formed on a surface of the sapphire substrate 11 in order to increase a critical angle at an interface between GaN/sapphire and thus enhance light extraction efficiency.

Meanwhile, nitride semiconductors formed on the sapphire substrate where the pattern is formed have a shape varied by the pattern formed on the sapphire substrate. First, when a pattern with square convex portions repeatedly arranged is formed on a surface of the sapphire substrate, the nitride semiconductors begin to grow from a flat surface of the square convex portions and a bottom surface of the substrate, i.e., c-plane. However, the nitride semiconductors are hardly grown along sides of the sapphire substrate. During a continuous growth, the nitride semiconductors formed on the square convex portions and the bottom surface converge and are gradually grown to define a flat surface.

Meanwhile, when curved convex portions are formed on the surface of the sapphire substrate, the nitride semiconductor begins to grow from the bottom surface whose crystal orientation is a c-plane. The nitride semiconductor does not grow on the curved convex portions of the sapphire substrate due to absence of a c-plane. Therefore, the nitride semiconductor which has started to grow from a flat bottom surface grows vertically and horizontally at the same time. Therefore, during a continuous growth of the nitride semiconductor, the nitride semiconductor fills the curved convex portions to define an overall flat surface.

That is, in a case where the nitride semiconductor light emitting device is manufactured using a patterned substrate, an n-clad layer, an active layer, and a p-clad layer may be formed before the nitride semiconductor layer grown on the sapphire substrate having a regular pattern formed thereon is completely flattened to thereby form curved indentations in the n-clad layer, active layer, and p-clad layer, respectively. However, the active layer is grown at a different rate and Si- or Mg-doped to a different doping concentration according to a crystal orientation. Therefore, the sapphire substrate having the regular pattern formed thereon as described above renders it hard to manufacture a nitride semiconductor light emitting device with high light emitting efficiency.

SUMMARY OF THE INVENTION

An aspect of the present invention provides a semiconductor light emitting device having a patterned substrate, which ensures better extraction efficiency, and changes a nitride semiconductor growth mode by a locally irregular pattern of the substrate to increase a surface area of an active layer, thereby enhancing internal quantum efficiency.

According to an aspect of the present invention, there is provided a nitride semiconductor light emitting device having a patterned substrate; the nitride semiconductor light emitting device including: a substrate; a first conductivity type nitride semiconductor layer, an active layer and a second conductivity type nitride semiconductor layer sequentially formed on the substrate, wherein the substrate is provided on a surface thereof with a pattern having a plurality of convex portions, wherein out of the plurality of convex portions of the pattern, a distance between a first convex portion and an adjacent one of the convex portions is different from a distance between a second convex portion and an adjacent one of the convex portions.

The convex portions of the pattern of the substrate may be non-periodically arranged. The convex portions of the pattern of the substrate each may have a vertical cross-section formed of a hemisphere. The first and second convex portions may have bottom surfaces sized differently from each other.

The convex portions of the pattern of the substrate each may have a vertical cross-section formed of a polygon. The first and second convex portions may be shaped identically and have bottom surfaces sized differently from each other. The first and second convex portions may differ in a growth plane of a nitride semiconductor from each other.

The convex portions of the pattern of the substrate may have vertical cross-sections formed of a combination of a hemisphere and a polygon. The polygon may be one of a trapezium, a square and a triangle.

The nitride semiconductor light emitting device may further include at least one buffer layer formed between the substrate and the first conductivity type nitride semiconductor layer.

The substrate may be a sapphire substrate. The active layer may have three-dimensional geometric curved indentations. The convex portions each may have a size of 0.1 μm to 10 μm.

According to another aspect of the present invention, there is provided a method of manufacturing a light emitting device having a substrate, a first conductivity type nitride semiconductor layer, an active layer and a second conductivity type nitride semiconductor layer, the method including: forming a pattern having a plurality of convex portions on a surface of the substrate; and growing the first conductivity type nitride semiconductor layer on the substrate where the pattern is formed, wherein the forming a pattern on a surface of the substrate includes forming the convex portions of the pattern such that a distance between a first convex portion and an adjacent one of the convex portions is different from a distance between a second convex portion and an adjacent one of the convex portions.

The method may further include forming at least one buffer layer on the substrate, before the growing the first conductivity type nitride semiconductor layer.

The forming a pattern on a surface of the substrate may include forming the first and second convex portions arranged non-periodically.

The forming a pattern on a surface of the substrate may include forming the first and second convex portions each having a vertical cross-section formed of a hemisphere. The forming a pattern on a surface of the substrate may include forming the first and second convex portions having bottom surfaces sized differently from each other.

The forming a pattern on a surface of the substrate may include the first and second convex portions each having a vertical cross-section formed of a polygon. The forming a pattern on a surface of the substrate may include forming the first and second convex portions having bottom surfaces sized differently from each other.

The forming a pattern on a surface of the substrate may include forming the first and second convex portions differing in a growth plane of a nitride semiconductor from each other.

The forming a pattern on a surface of the substrate may include forming the first and second convex portions having vertical cross-sections formed of a combination of a hemisphere and a polygon. The polygon may include one of a trapezium, a square and a triangle.

The substrate may be a sapphire substrate. The active layer may have three-dimensional geometric curved indentations. The forming a pattern on a surface of the substrate may include forming the convex portions each having a size of 0.1 μm to 10 μm.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
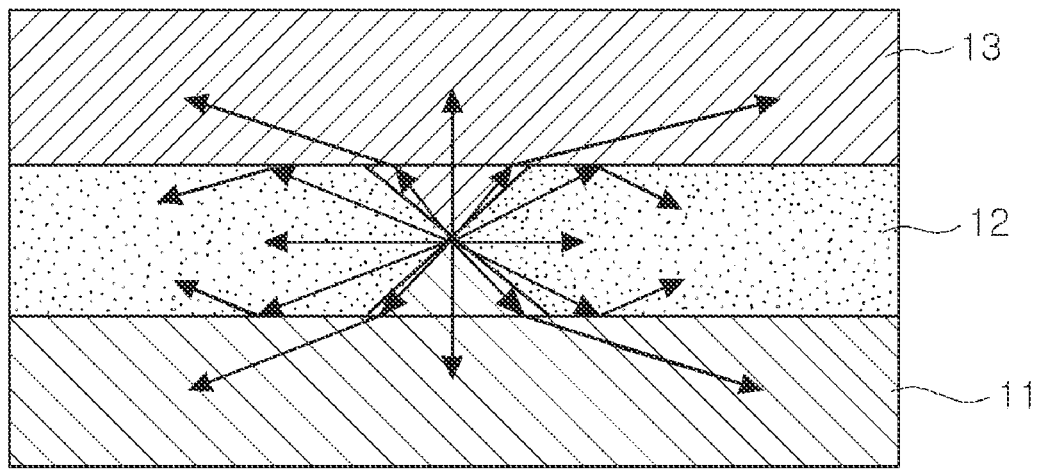
FIG. 1 illustrates light propagated on optical paths in a nitride light emitting device.

Exemplary embodiments of the present invention will now be described in detail with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity.

In the present invention, to maximize internal quantum efficiency and extraction efficiency as well, convex portions of a pattern are not formed regularly across a surface of a growth substrate, but the convex portions are locally varied in shape and size, and distance therebetween. That is, when the growth substrate employs a sapphire substrate, the convex portions are locally varied in shape, size or distance therebetween so as to change an area of a growth plane such as a c-plane in sapphire crystal planes, where the nitride semiconductor is grown first.

Accordingly, to maximize extraction efficiency of the light emitting device, the pattern of the substrate has locally irregular microstructures while retaining regular microstructures. This allows a growth mode of a nitride semiconductor grown on the substrate, i.e., morphology according to a change in a growth rate, to be in a protruded or depressed configuration. Thus, a growth mode of the active layer grown thereon is also defined by a protruded or depressed structure, thereby ensuring maximum internal and external quantum efficiency.

Specifically, the nitride semiconductor light emitting device having the patterned substrate according to the present embodiment includes the substrate, a first conductivity type nitride semiconductor layer, the active layer and a second conductivity type nitride semiconductor. The substrate is provided on a surface thereof with a pattern having a plurality of convex portions. Out of the plurality of convex portions of the pattern, a distance between a first convex portion and an adjacent one of the convex portions is different from a distance between a second convex portion and an adjacent one of the convex portions.

The convex portions of the pattern of the substrate are non-periodically arranged. Each of the convex portions of the pattern of the substrate has a vertical cross-section formed of a hemisphere. The first and second convex portions have bottom surfaces sized differently from each other. Alternatively, the convex portion of the pattern of the substrate has a vertical cross-section formed of a polygon. The first and second convex portions are shaped identically and have bottom surfaces sized differently from each other. The first and second convex portions may differ in a growth plane of the nitride semiconductor. Also, the convex portions of the pattern of the substrate may have vertical cross-sections formed of a combination of a hemisphere and a polygon. Here, the polygon may be one of trapezium, square and triangle. Moreover, the nitride semiconductor light emitting device further includes at least one buffer layer between the substrate and the first conductivity type nitride semiconductor layer. The substrate is a sapphire substrate and the active layer has three-dimensional geometric curved indentations. The convex portion of the pattern of the substrate may have a size of 0.1 µm to 10 µm.

Meanwhile, regarding a method of manufacturing a light emitting device having the patterned substrate according to an exemplary embodiment of the invention, the light emitting device includes a substrate, a first conductivity type nitride semiconductor layer, an active layer and a second conductivity type nitride semiconductor layer. In order to manufacture the light emitting device, a pattern having a plurality of convex portions is formed on a surface of the substrate. Also, the first conductivity type nitride semiconductor layer is grown on the substrate where the pattern is formed. In forming the pattern of the substrate, out of the plurality of convex portions, a distance between a first convex portion and an adjacent one of the convex portions is different from a distance between a second convex portion and an adjacent one of the convex portions. Also, in the method of manufacturing the nitride semiconductor light emitting device, at least one buffer layer is formed on the substrate before growing the first conductivity type nitride semiconductor layer.

Moreover, in forming the pattern of the substrate, the first and second convex portions are arranged non-periodically. The first and second convex portions each have a vertical cross-section formed of a hemisphere and have bottom surfaces sized differently from each other. Alternatively, in forming the pattern of the substrate, the first and second convex portions each have a vertical cross-section formed of a polygon and are formed in an identical shape but have the bottom surfaces sized differently from each other. Also, the first and second convex portions are formed to differ in a growth plane of the nitride semiconductor. Alternatively, in forming the pattern of the substrate, the first and second convex portions have vertical cross-sections formed of a combination of a hemisphere and a polygon. Here, the polygon may be one of trapezium, square and triangle. The substrate is a sapphire substrate and the active layer has three-dimensional geometric curved indentations. In forming the pattern, each of the convex portions of the substrate may have a size of 0.1 µm to 10 µm.

Figure 2:
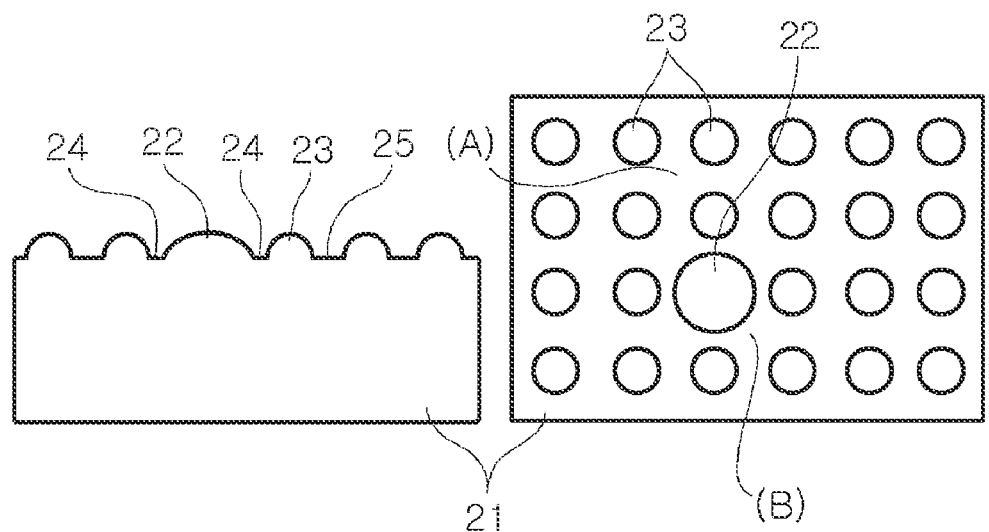
FIG. 2 is a cross-sectional view illustrating a patterned substrate applied to a nitride semiconductor light emitting device according to an exemplary embodiment of the invention.

FIG. 2 is a cross-sectional view illustrating a patterned substrate employed in a nitride semiconductor light emitting device according to an exemplary embodiment of the invention, in which convex portions each have a vertical cross-section formed of a hemisphere.

As shown in FIG. 2, hemispherical microstructures 23 arranged periodically on a growth substrate 21 to form a pattern and hemispherical microstructures 22 with different sizes from the hemispherical microstructures 23 are arranged locally to form another pattern. Also, hereinafter, even though a singular microstructure is illustrated in the drawings to define a pattern, the microstructure may be construed to include a plurality of microstructures to define the pattern. Thus, the singular microstructure for forming the pattern illustrated in the drawings will be described as a plurality of microstructures if necessary.

Here, the microstructures arranged uniformly across the growth substrate 21 define a matrix pattern and the microstructures having shape, size and distance therebetween different from the matrix pattern define a local pattern.

The hemispherical microstructures 22 and 23 in the matrix pattern and local pattern are different in size from each other. Thus, a distance between the hemispherical microstructures 23 of the matrix pattern and a corresponding adjacent one of convex portions is different from a distance between the hemispherical microstructures 22 and a corresponding adjacent one of the convex portions.

As a result, the bottom surface of the growth substrate where the nitride semiconductor starts to grow has different c-plane areas as indicated by regions (A) and (B).

Figure 3:
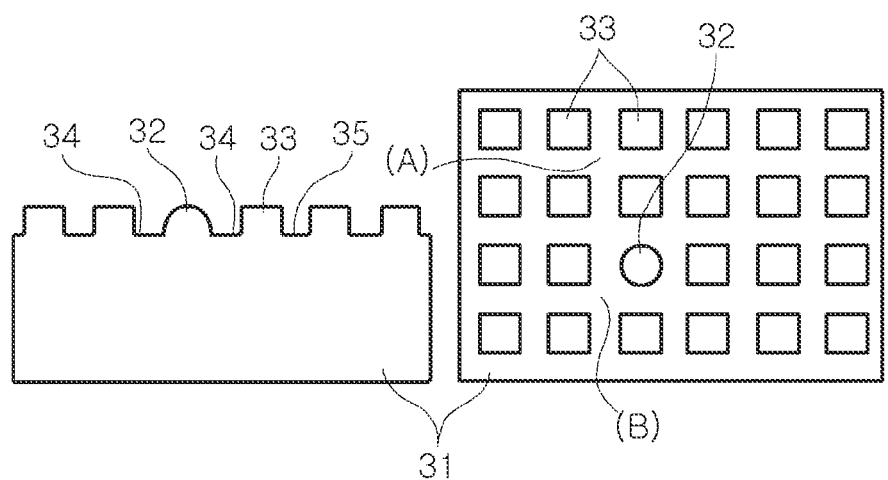
FIG. 3 is a cross-sectional view illustrating a patterned substrate applied to a nitride semiconductor light emitting device according to another exemplary embodiment of the invention.

FIG. 3 is a cross-sectional view illustrating a patterned substrate employed in a nitride semiconductor light emitting device according to another exemplary embodiment of the invention, in which each of convex portions has a vertical cross-section formed of a hemisphere or a square.

As shown in FIG. 3, square microstructures 33 are arranged periodically on a growth substrate 31 to form a pattern, and hemispherical microstructures 32 are locally arranged to form another pattern. Here, a distance between convex portions of the patterns of the substrate is identical, but due to difference in shape of the convex portions, the growth substrate 31 adjacent to the convex portions has bottom surfaces sized differently from each other as indicated by regions (A) and (B).

Moreover, in the pattern of the hemispherical microstructures 32, the convex portions do not have a c-plane and thus the nitride semiconductor begins to grow only from a c-plane of the bottom surface 34, i.e., region (B) of the substrate. However, in the pattern of the square microstructures 33, the nitride semiconductors start to grow from the c-plane of the convex portions 33 and bottom surface 35, i.e., region (A) at the same time.

Figure 4:
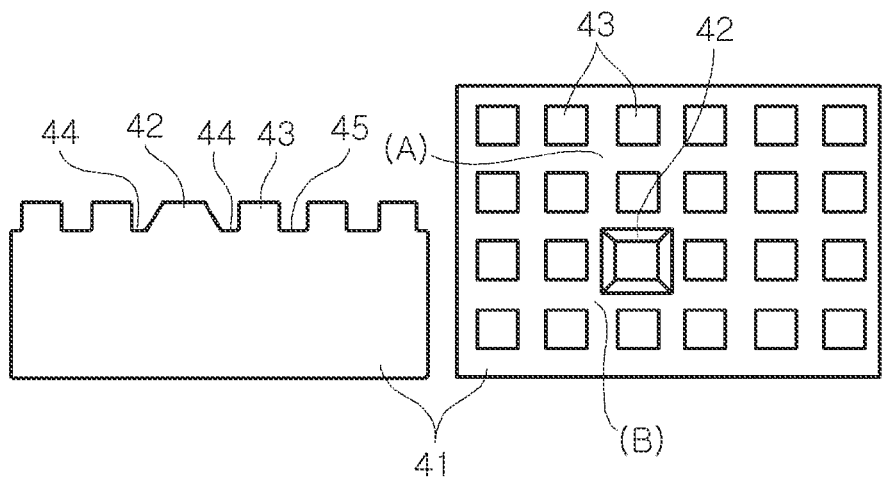
FIG. 4 is cross-sectional view illustrating a patterned substrate applied to a nitride semiconductor light emitting device according to still another exemplary embodiment of the invention.

FIG. 4 is a cross-sectional view illustrating a patterned substrate employed in a nitride semiconductor light emitting device according to still another embodiment of the invention, in which convex portions each have a vertical cross-section formed of a trapezium or a square.

As shown in FIG. 4, square microstructures 43 are periodically arranged on a growth substrate 41 to form a pattern, and trapezium microstructures 42 are locally arranged to form another pattern.

That is, a distance between the trapezium microstructure 42 in a local pattern and an adjacent one of the convex portions is different from a distance between the square microstructure 43 in a matrix pattern and an adjacent one of the convex portions.

Therefore, c-planes of the convex portion of the trapezium microstructure 42 in the local pattern and a bottom surface 44 adjacent thereto are different from c-planes of the convex portion of the square microstructure 43 in the matrix pattern and a bottom surface 45 adjacent thereto. Accordingly, areas where the nitride semiconductors are grown differ from each other as shown in regions (A) and (B).

Figure 5:
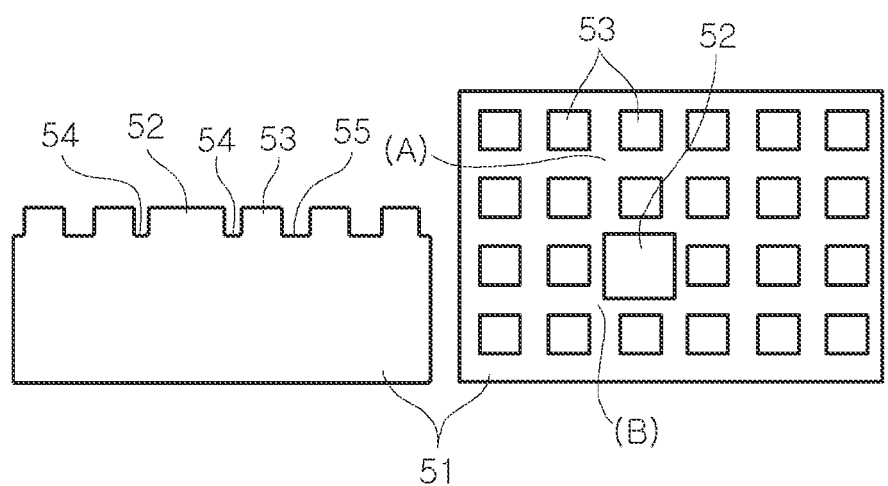
FIG. 5 is cross-sectional view illustrating a patterned substrate applied to a nitride semiconductor light emitting device according to yet another exemplary embodiment of the invention.

FIG. 5 is a cross-sectional view illustrating a patterned substrate employed in a nitride semiconductor light emitting device according to yet another embodiment of the invention, in which convex portions each have a vertical cross-section formed of a square.

As shown in FIG. 5, square microstructures 53 are periodically arranged on a growth substrate 51 to forma matrix pattern, and square microstructures 52 sized greater than the square microstructures 53 are locally arranged to form a local pattern.

A distance between the square microstructure 52 in the local pattern and a bottom surface adjacent thereto 54 is smaller than a distance between the square microstructure 53 in the matrix pattern and a bottom surface 55 adjacent thereto. Accordingly, growth planes areas of the nitride semiconductor, i.e., c-plane areas are different form each other as shown in regions (A) and (B).

Therefore, as depicted in FIGS. 2 to 5, the local pattern, i.e., the pattern of different shapes, or the pattern of an identical shape but different size, is formed locally between microstructures of a periodic pattern, i.e., matrix pattern to locally change an area of the c-plane.

Moreover, according to the present embodiment, as shown in FIGS. 2 to 5, the matrix pattern and the local pattern locally formed in the matrix pattern may define one pattern to be periodically arranged, thereby periodically changing an area of the c-plane.

Also, in the present embodiment, the growth substrate employs the sapphire substrate, but the present invention is not limited thereto. In addition, referring to FIGS. 2 to 5, the patterns are identical in height, but regardless of a change in height of the patterns, growth areas in the sapphire substrate are changed on a c-plane where the nitride semiconductor begins to grow.

Furthermore, the nitride semiconductor may be grown immediately on the c-plane sapphire substrate. Alternatively, the buffer layer may be grown to improve crystallinity and the substrate may have a surface physically and chemically treated to grow the nitride semiconductor.

The pattern of the sapphire substrate is locally varied in shape, size and distance between microstructures thereof to change an area where the nitride semiconductor begins to grow. This is because the nitride semiconductor is locally changed in growth mode as shown in FIGS. 6 to 8.

FIGS. 6 to 8 are cross-sectional views illustrating a stepwise growth mode of a nitride semiconductor grown on the pattered substrates according to the embodiments shown in FIGS. 2 to 5.

FIG. 6A to 6D are a cross-sectional view for explaining a stepwise growth mode in a nitride semiconductor substrate grown on the patterned substrate according to the embodiment shown in FIG. 2.

Figure 6A:
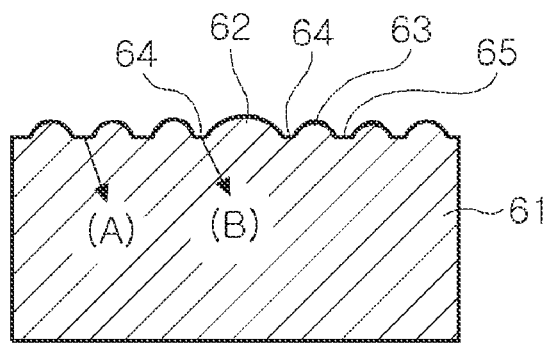
FIG. 6A to 6D are a cross-sectional view for explaining a stepwise growth mode of a nitride semiconductor grown on a patterned substrate according to the embodiment shown in FIG. 2.

As shown in FIG. 6A, hemispherical microstructures 63 are periodically formed on a surface of a sapphire substrate to define a matrix pattern. Also, hemispherical microstructures 62 sized differently from the hemispherical microstructures 63 are locally formed to define a local pattern. At this time, a distance between the hemispherical microstructure 62 and an adjacent one of convex portions is different from a distance between the hemispherical microstructure 63 and an adjacent one of the convex portions. That is, a c-plane area of region (B) adjacent to the hemispherical microstructure 62 with different size in the local pattern is smaller than a c-plane area of region (A).

Here, in a case where a nitride semiconductor thin film is grown by organic chemical deposition, the nitride semiconductor grows on a c-plane of the sapphire substrate. On the other hand, the nitride semiconductor is not grown on the hemispherical microstructures because a crystal structure of surface atoms is significantly different from a crystal structure of the nitride semiconductor.

Therefore, nitride semiconductor atoms approaching over the hemispherical microstructures to be adsorbed are not grown on the hemispherical microstructures but migrate to a c-plane threaround.

Figure 6B:
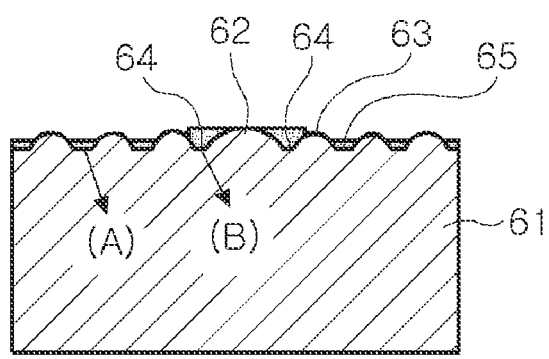
Figure 6C:
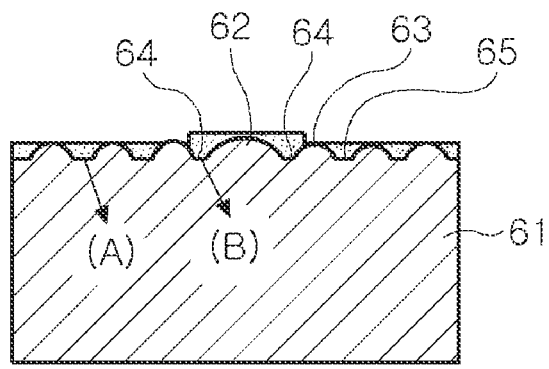

As shown in FIGS. 6B and 6C, the region (B) corresponds to a bottom surface 64 adjacent to the hemispherical microstructure 62 with greater size. This expedites a growth rate of the nitride semiconductor in a c-axis direction due to a great number of nitride semiconductor atoms migrating from the matrix pattern and a relatively narrow area of the c-plane area as described above.

Figure 6D:
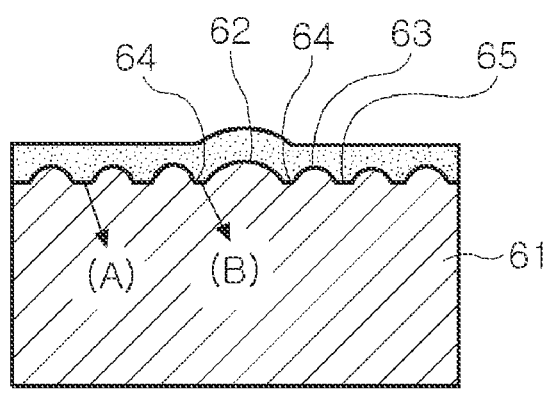

Accordingly, a faster growth rate of the nitride semiconductor in the region (B) as shown in FIG. 6D leads to a greater thickness of a nitride semiconductor film on the convex portion 62 in the local pattern.

FIG. 7A to 7D are a cross-sectional view for explaining a stepwise growth mode of a nitride semiconductor grown on the sapphire substrate where the pattern of square microstructures is formed according to the embodiment shown in FIG. 5.

Figure 7A:
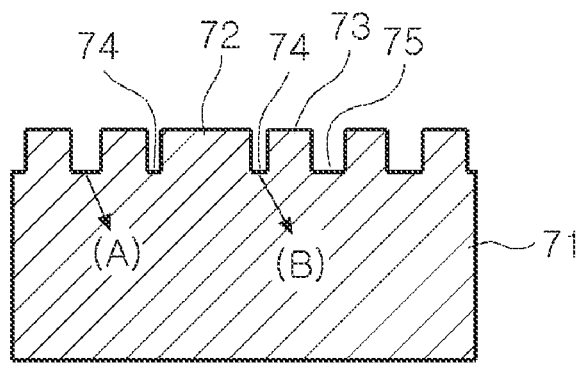
FIG. 7A to 7D are a cross-sectional view for explaining a stepwise growth mode of a nitride semiconductor grown on a sapphire substrate where a pattern of square microstructures is formed according to the embodiment of FIG. 5.

As shown in FIG. 7A, square microstructures 73 are formed periodically on a surface of a sapphire substrate 71 to define a matrix pattern, and square microstructures 72 with different size are formed locally to define a local pattern. At this time, a distance between the square microstructure 72 in the local pattern and an adjacent one of the convex portions is different from a distance between the square microstructure 73 in the matrix pattern and the convex portion adjacent thereto. That is, a c-plane area in region (B) adjacent to the square microstructure 72 of different size in the local pattern is smaller than a c-plane area in region (A).

Figure 7B:
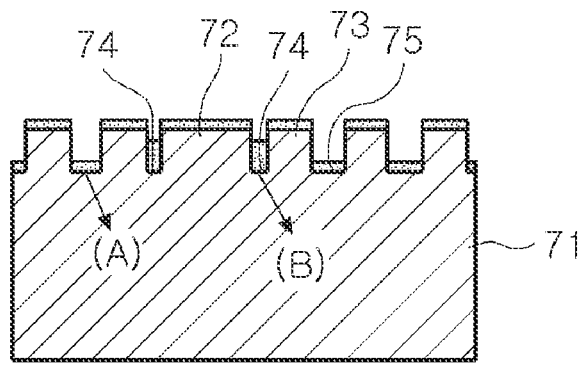
Figure 7C:
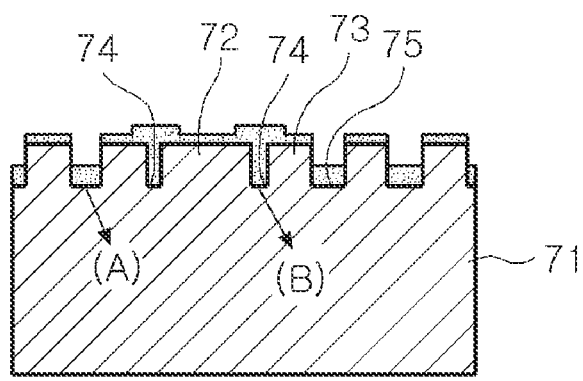

As shown in FIGS. 7B and 7C, the region (B) corresponds to a bottom surface 74 adjacent to the square microstructure 72 with greater size. This expedites a growth rate of the nitride semiconductor in a c-axis direction due to a great amount of nitride semiconductor atoms migrating from the periodic square microstructures 73 of the matrix pattern and a relatively smaller area of the c-plane area.

Figure 7D:
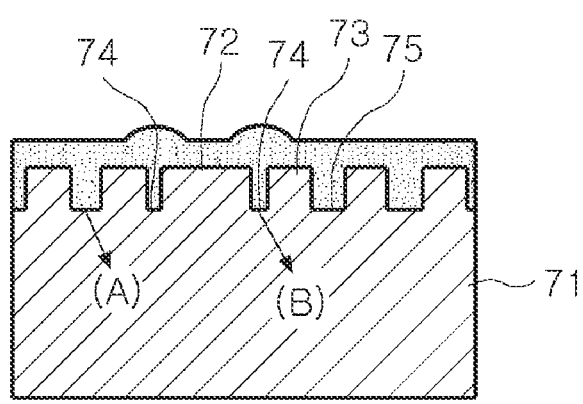

Therefore, as shown in FIG. 7D, as the nitride semiconductor film is grown to be entirely covered, the nitride semiconductor in region (B) of the local pattern has a thickness greater than a thickness of the nitride semiconductor in region (A), thereby leading to a convex-shaped surface.

FIG. 8A to 8D are a cross-sectional view for explaining a stepwise growth mode of a nitride semiconductor grown on only a bottom surface of a sapphire substrate where a pattern of square microstructures is formed according to the embodiment of FIG. 5.

As shown in FIG. 8A to 8D, in the sapphire substrate 81 where the pattern of square microstructures is formed, convex portions of the pattern of the substrate 81 are surface-treated. This prevents the nitride semiconductor from being grown on a c-plane of the convex portions and allows the nitride semiconductor to be grown only on the bottom surface.

Figure 8A:
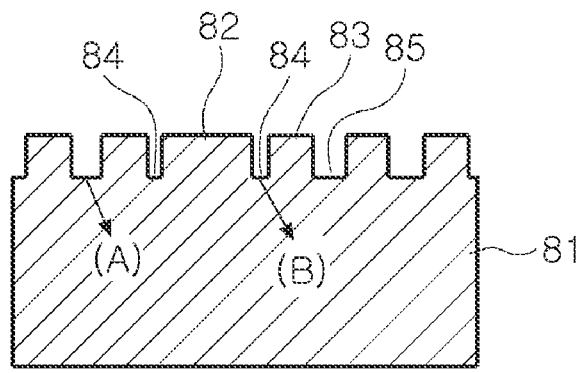
FIG. 8A to 8D are a cross-sectional view for explaining a stepwise growth mode of a nitride semiconductor grown on only a bottom surface of a sapphire substrate where a pattern of square microstructures is formed according to the embodiment of FIG. 5.

As shown in FIG. 8A, a square microstructure 82 of different size is locally formed to define a local pattern, on the sapphire substrate 81 where the matrix pattern of periodic square microstructures 83 is formed. Accordingly, a distance between the square microstructure 82 of the local pattern and an adjacent one of convex portions is different from a distance between the square microstructure 83 of the matrix pattern and an adjacent one of the convex portions. That is, a c-plane area in region (B) of a bottom surface 84 adjacent to the square microstructure 82 of the local pattern is smaller than a c-plane area in region (A) of a bottom surface 85 adjacent to the periodic square microstructures 83 in the matrix pattern.

The nitride semiconductor is grown on this sapphire substrate 81.

Figure 8B:
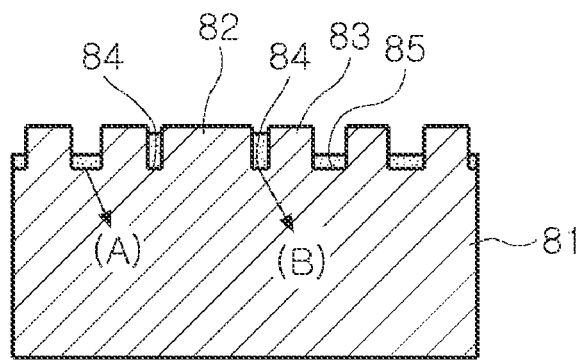
Figure 8C:
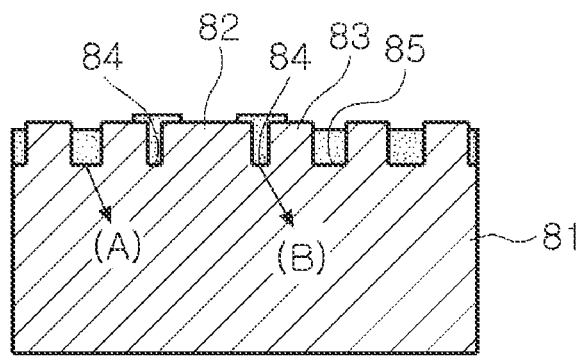

Accordingly, as shown in FIGS. 8B and 8C, the nitride semiconductor is grown fast in the region (B), i.e, c-plane of the square microstructure 82 of the local pattern whose distance from an adjacent one of convex portion is smaller than a distance between the square microstructure 83 of the matrix pattern and an adjacent one of the convex portions.

Figure 8D:
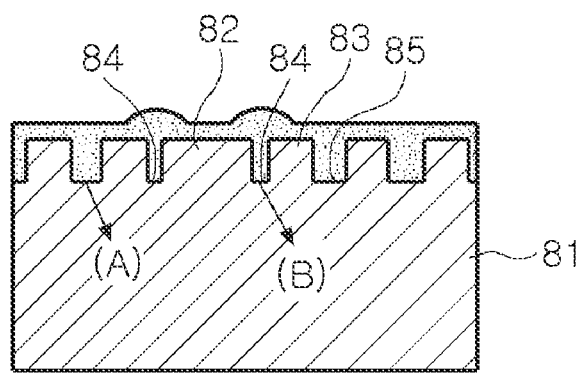

Therefore, as shown in FIG. 8D, the nitride semiconductor in region (B) having a smaller distance is grown with a greater thickness than the nitride semiconductor in region (A), thereby leading to a convex-shaped surface. That is, the nitride semiconductor has a surface morphology in at least one of protruded and depressed configuration according to the pattern of the substrate.

Figure 9:
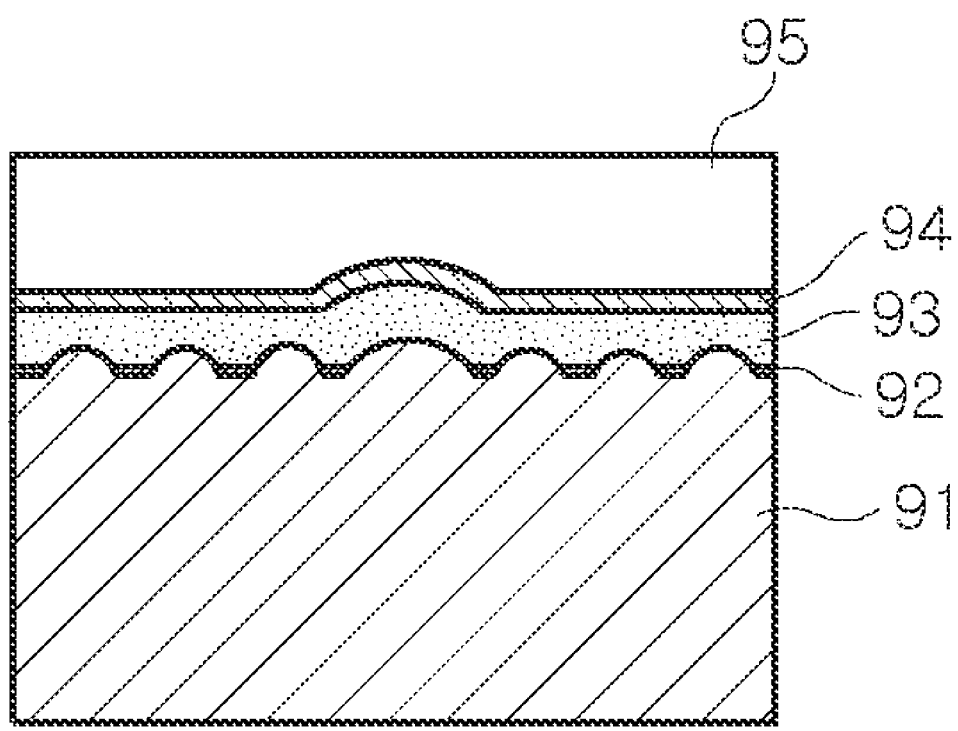
FIG. 9 is a cross-sectional view illustrating a nitride semiconductor light emitting device employing the patterned substrate shown in FIG. 2.

FIG. 9 is a cross-sectional view illustrating a nitride semiconductor light emitting device employing the patterned substrate according to the embodiment shown in FIG. 2. Here, the nitride semiconductor light emitting device of the present embodiment is not limited to the patterned substrate shown in FIG. 2 but may adopt one of the pattered substrates shown in FIGS. 2 to 5. Moreover, the nitride semiconductor light emitting device may employ any substrate including a pattern having convex portions and a bottom surface, which differs in a c-plane where the nitride semiconductor is grown.

As shown in FIG. 9, a patterned substrate 91 is provided and a buffer layer 92 is grown on a surface of the patterned substrate 91 to enhance crystallinity of a nitride semiconductor layer. Then, a nitride semiconductor is grown on the substrate 91 where the buffer layer 92 is formed. This allows an n-type nitride semiconductor layer 93 and an active layer 94 to be formed in a locally protruded and depressed structure. Also, a p-type nitride semiconductor layer 95 is formed on the active layer 94. Local protrusion and depression in the active layer 94, i.e., three-dimensional geometric curved indentations increase a surface area of the active layer 94. Accordingly, this enhances optical output of the light emitting device.

Moreover, the shape of the pattern and the growth condition of the nitride semiconductor are changed to facilitate local formation of three-dimensional quantum dots with high light emitting efficiency, thereby improving internal quantum efficiency of the nitride semiconductor light emitting device.

To improve characteristics of the light emitting device according to the present embodiment, the convex portions of the pattern of the substrate each may have a size of 0.1 μm to 10 μm and a height of 0.1 μm to 5 μm. The local pattern can be adjusted to represent 1% to 50% of the matrix pattern. The local pattern may represent 0.1% to 20% of the matrix pattern to ensure the nitride semiconductor is epitaxially grown on the patterned substrate smoothly.

As set forth above, according to exemplary embodiments of the invention, in a nitride semiconductor growth substrate having a patterned substrate, an irregular pattern is locally formed on the growth substrate to allow light confined into an epitaxial layer due to total internal reflection to be extracted outward through a change in a critical angle at a smoothly indented surface of the substrate, with higher efficiency.

Moreover, in the nitride semiconductor growth substrate having the patterned substrate, an irregular pattern is locally formed on a growth substrate to form curved indentations on a growth plane of an active layer. This increases a light emitting area of the active layer and results in formation of a quantum dot structure, thereby improving internal quantum efficiency and maximizing optical efficiency of the light emitting device.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of manufacturing a light emitting device including a substrate, a first conductivity type nitride semiconductor layer, an active layer and a second conductivity type nitride semiconductor layer, the method comprising:
    forming a pattern having a plurality of convex portions on a surface of the substrate; and
    growing the first conductivity type nitride semiconductor layer on the substrate where the pattern is formed,
    wherein the forming a pattern on a surface of the substrate comprises forming the convex portions of the pattern such that a distance between a first convex portion and an adjacent one of the convex portions is different from a distance between a second convex portion and an adjacent one of the convex portions,
    wherein the first conductivity type nitride semiconductor layer has a locally protruded and depressed structure and the active layer has a three-dimensional geometric curved indentation corresponding to the locally protruded and depressed structure of the first conductive nitride semiconductor layer.

2. The method of claim 1, further comprising forming at least one buffer layer on the substrate, before the growing the first conductivity type nitride semiconductor layer.

3. The method of claim 1, wherein the forming a pattern on a surface of the substrate comprises forming the first and second convex portions arranged non-periodically.

4. The method of claim 1, wherein the forming a pattern on a surface of the substrate comprises forming the first and second convex portions each having a vertical cross-section formed of a hemisphere.

5. The method of claim 4, wherein the forming a pattern on a surface of the substrate comprises forming the first and second convex portions having bottom surfaces sized differently from each other.

6. The method of claim 1, wherein the forming a pattern on a surface of the substrate comprises the first and second convex portions each having a vertical cross-section formed of a polygon.

7. The method of claim 6, wherein the forming a pattern on a surface of the substrate comprises forming the first and second convex portions having bottom surfaces sized differently from each other.

8. The method of claim 6, wherein the forming a pattern on a surface of the substrate comprises forming the first and second convex portions differing in a growth plane of a nitride semiconductor from each other.

9. The method of claim 1, wherein the forming a pattern on a surface of the substrate comprises forming the first and second convex portions having vertical cross-sections formed of a combination of a hemisphere and a polygon.

10. The method of claim 6, wherein the polygon comprises one of a trapezium, a square and a triangle.

11. The method of claim 9, wherein the polygon comprises one of trapezium, a square and a triangle.

12. The method of claim 1, wherein the forming a pattern on a surface of the substrate comprises forming the convex portions each having a size of 0.1 μm to 10 μm.

13. The method of claim 1, wherein the substrate is a sapphire substrate.

* * * * *